United States Patent [19]

Kim et al.

[11] Patent Number: 5,432,360
[45] Date of Patent: Jul. 11, 1995

[54] SEMICONDUCTOR DEVICE INCLUDING AN ANODE LAYER HAVING LOW DENSITY REGIONS BY SELECTIVE DIFFUSION

[75] Inventors: Hohyun Kim, Kyungki-do; Chanho Park, Incheon, both of Rep. of Korea

[73] Assignee: Samsung Electronics Co., Ltd., Kyungki-do, Rep. of Korea

[21] Appl. No.: 202,195

[22] Filed: Feb. 24, 1994

[30] Foreign Application Priority Data

Feb. 24, 1993 [KR] Rep. of Korea .................. 93-2593

[51] Int. Cl.6 .................. H01L 29/861; H01L 29/885
[52] U.S. Cl. .................................... 257/104; 257/577; 257/653
[58] Field of Search .............. 257/104, 106, 105, 497, 257/487, 577, 653, 644, 603, 605, 917

[56] References Cited

U.S. PATENT DOCUMENTS 4,017,882 4/1977 Kannam et al. .................. 257/497

FOREIGN PATENT DOCUMENTS 58-125875 7/1983 Japan .................. 57/106

Primary Examiner—Jerome Jackson
Assistant Examiner—Donald L. Monin, Jr.
Attorney, Agent, or Firm—Stephen R. Whitt; Robert A. Westerlund; Charles R. Donohoe

[57] ABSTRACT

A semiconductor diode characterized by an anode electrode structure connected to a double diffusion of P-type impurities in a major surface of an $N^-$ semiconductor. The first diffusion forming a first plurality of $P^-$ well regions and the second diffusion selectively forming a second plurality of $P^+$ well regions within the first well region.

2 Claims, 4 Drawing Sheets

5,432,360

SEMICONDUCTOR DEVICE INCLUDING AN ANODE LAYER HAVING LOW DENSITY REGIONS BY SELECTIVE DIFFUSION

BACKGROUND OF THE INVENTION

The present invention relates to a semiconductor device including a anode layer having regions of low impurity density created by selective diffusion. More particularly, the present invention relates to a semiconductor device capable of removing accumulated carriers through an anode terminal coupled to an anode layer including low density regions formed by the selective diffusion of impurities. By this structure, the present invention enjoys reliable operation with low loss and with fast reverse recovery.

FIGS. 1(A), 1(B), 1(C), and 1(D) illustrate sectional views of prior art semiconductor devices. FIG. 1(A) is a sectional view of a basic vertical PN diode. FIGS. 1(B), 1(C), and 1(D) are sectional views of well-known variations of the basic PN diode structure including additional structural elements for reducing reverse recovery time.

Conventional semiconductor devices generally suffer from high electrical loss and/or slow reverse recovery time. In conventional devices, electrical charge in the form of excess minority carders accumulates in forward biased diodes. This charge switches from a forward biased direction to a reversed biased direction in proportion to a externally switched forward biased current. During this switching period, a diode having a high breakdown voltage requires a high internal resistance which results in unacceptably long reverse recovery time (i.e., recombination time). This adverse affect and the resulting electrical loss increases with the switching frequency of the diode.

Accordingly, semiconductor devices operating at high switching frequencies typically become more complex in an attempt to compensate for the adverse affect described above. Exemplary of these more complex circuits is the Schottky barrier diode. However, the Schottky barrier diode suffers from a high leakage current and low breakdown voltage. To avoid these disadvantages, the prior art often incorporates a lifetime killer dopant within the basic diode structure shown in FIG. 1(A) in order to reduce reverse time recovery.

Referring to FIG. 1(A), the conventional diode structure includes a cathode electrode 2 in ohmic contact with a N+ semiconductor layer 3. A N− semiconductor layer 4 is formed over N+ layer 3. As customarily indicated by the (+ and −), N− layer 4 has an impurity concentration, or density, relatively lower than N+ layer 3. With respect to semiconductor layer 3 and 4, as well as all subsequent semiconductor layers described below, a determination of the exact impurity densities is the subject to various design considerations and is widely considered to be within the range of ordinary skill in the art. Only type and the relative density of the impurities are of importance with respect to the present invention described below.

Referring again to FIG. 1(A), a P+ well region 6 is formed by diffusing P-type impurities into a major surface of N− layer 4. Finally, an anode electrode 1 is overlaid upon the major surface in ohmic contact with P+ well region 6 through a insulating mask layer 5. The above-mentioned electrical loss for the conventional semiconductor diode structure shown in FIG. 1(A) results from a high voltage drop and a high leakage current at high temperature.

In an attempt to reduce the reverse recovery time associated with the basic diode structure above, the prior art has proposed the structure shown in FIG. 1(B). This structure differs from the one shown in FIG. 1(A) in that the P+ well region 6 is replaced by a complex structure including a plurality of deep P+ well regions 6 joined by intervening shallow P− regions 7. The plurality of P+ well regions 6 are generally formed by impurity, such as boron, diffusion. On the other hand, P− regions 7 are formed by ion implantation.

The structures shown in FIGS. 1(C) and 1(D) are additional prior attempts to reduce reverse recovery time and voltage drop. The structure shown in FIG. 1(C) includes a P-type layer formed over N− layer 4 and a well structure formed in a major surface of the P-type layer including alternating P+ regions 6 and N+ regions 8. The structure shown in FIG. 1(D) replaces the shallow P− regions 7 of the structure in FIG. 1(B) with Schottky barrier contacts 9.

The resulting structures in FIGS. 1(B), 1(C), and 1(D) enjoy better reverse recovery time and lower voltage drop than the basic diode structure of FIG. 1(A). However, these advantages come at the price of structural complexity and the associated additional manufacturing steps.

SUMMARY OF THE INVENTION

It is therefore an object of the present invention to provide a semiconductor device having reduced reverse recovery time and low voltage drop which can be implemented in a relatively simple structure using an efficient manufacturing method. This object can be obtained by a semiconductor device comprising; a cathode electrode, a first semiconductor layer of first conductivity type having a high impurity density formed in ohmic contact with the cathode electrode, a second semiconductor layer of first conductivity type having a low impurity density relative to the first semiconductor layer, and having first and second major surfaces, the first major surface formed in contact with the semiconductor layer, a first plurality of well regions of second conductivity type having a low impurity density selectively formed by diffusion in the second major surface, a second plurality of well regions of second conductivity type having a high impurity density relative to the first plurality of well regions selectively formed by diffusion in the first plurality of well regions, and an anode electrode formed over the second major surface of the second semiconductor layer in ohmic contact with the first plurality of well regions and the second plurality of well regions.

The present invention also provides a bipolar semiconductor device comprising; a cathode electrode, a first semiconductor layer of first conductivity type having a high impurity density formed in ohmic contact with the cathode electrode, a second semiconductor layer of first conductivity type having a low impurity density relative to the first semiconductor layer, and having first and second major surfaces, the first major surface formed in contact with the first semiconductor layer opposite the cathode electrode, a transistor formed in the second major surface, and comprising a base region of second conductivity type formed in the second major surface, an emitter region of first conductivity type formed in the base region, a first electrode formed in ohmic contact with the emitter region, and a second electrode formed in ohmic contact with the emitter region, and a diode formed in the second major surface and comprising, a first plurality of well regions of second conductivity type having a low impurity density selectively formed by diffusion in the second major surface, a second plurality of well regions of second conductivity type having a high impurity density relative to the first plurality of well regions selectively formed by diffusion in the first plurality of well regions, and a common electrode formed over the second major surface in ohmic contact with the first plurality of well regions, the second plurality of well regions, and the base region.

BRIEF DESCRIPTION OF THE DRAWINGS

The above object and other advantages of the present invention will become more apparent upon consideration of preferred embodiments of the present invention described with reference to the attached drawings in which.

DETAILED DESCRIPTION OF THE INVENTION

Figure 1A:
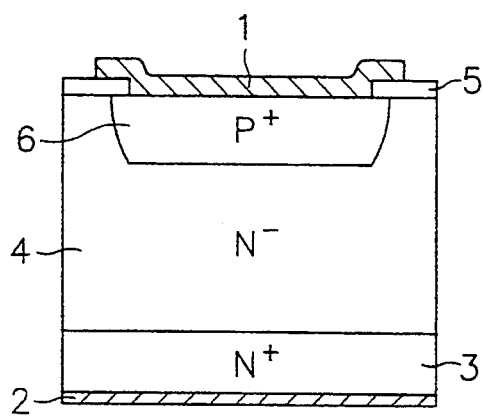
FIG. 1(A) is a sectional view of a conventional, vertical structure, PN junction diode.
Figure 1B:
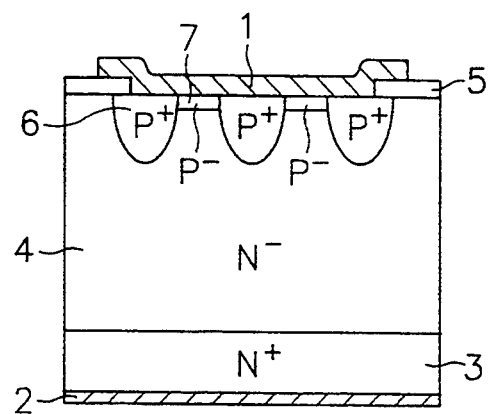
FIGS. 1(B), 1(C), and 1(D) are sectional views of conventional PN junction diodes having reduced reverse recovery time.
Figure 1C:
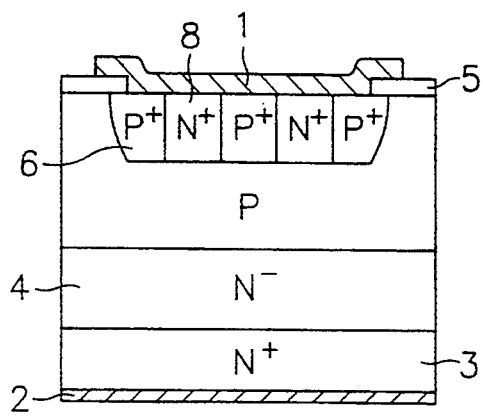
Figure 1D:
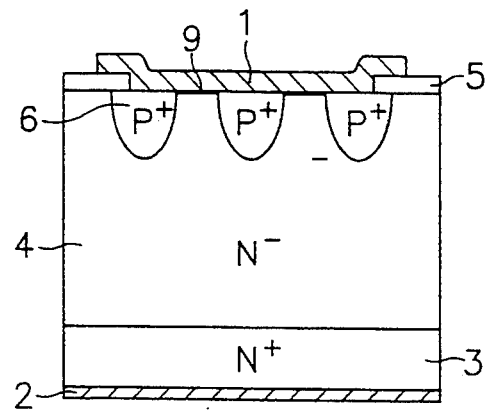
Figure 2A:
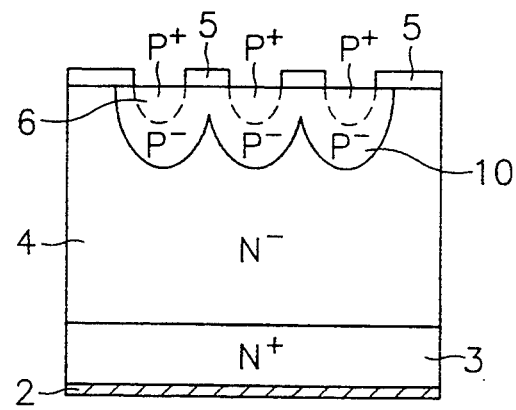
FIGS. 2(A) and 2(B) are sectional views of a vertical structure, PN junction diode according to a first embodiment of the present invention.
Figure 2B:
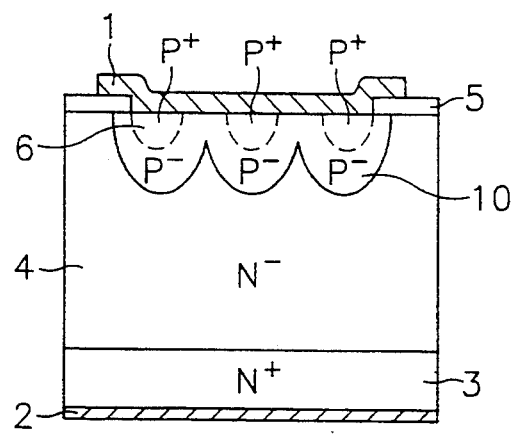
Figure 2C:
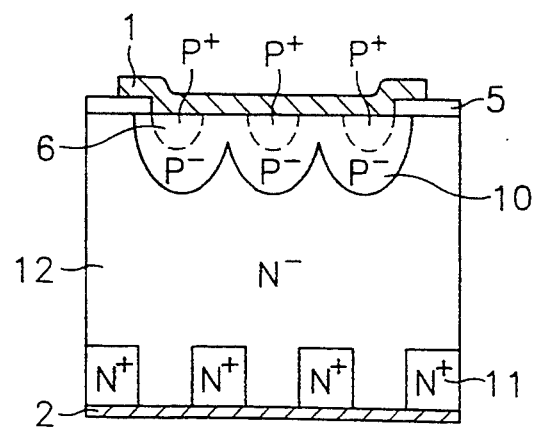
FIG. 2(C) is sectional view of a vertical structure, PN junction diode according to a second embodiment of the present invention.

FIGS. 2(A), 2(B), and 2(C) illustrate preferred embodiments of the present invention. Elements similar to those described above with respect to prior art diode structures are similarly designated in FIGS. 2(A) through 2(C).

As shown in FIGS. 2(A) and 2(B), a first embodiment of the present invention includes; cathode electrode 2, first N+ semiconductor layer 3, and second N− semiconductor layer 4 as previously described. Incorporated within a (second) major surface of N− semiconductor layer 4 opposite the (first) major surface of N− semiconductor layer 4 overlaying N+ semiconductor layer 3 is a first plurality of P− well regions 10. P− well regions 10 are preferably formed by one or more diffusion steps. As shown in FIG. 2(A), once P− well regions 10 have been formed in the second major surface of second N− semiconductor layer 4, insulating mask layer 5 is applied to the second major surface and patterned for use in selectively forming a second plurality of P+ well regions 6. P+ well regions 6 are then selectively formed by diffusion within the first plurality of P− well regions 10. Subsequently, as shown in FIG. 2(B), an additional portion of insulating mask layer 5 is patterned away and anode electrode 1 is applied to the second major surface of N− semiconductor layer 4 in ohmic contact with P− well regions 10 and P+ well regions 6. By ohmic contact, it is meant that anode electrode 1 is formed so as to electrically communicate with P− well regions 10 and P+ well regions 6. Again, as mentioned above, P− and P+ are used to indicate relative differences in the impurity densities, P− being relatively low density with respect to P+ high density.

A second embodiment of the present invention is shown in FIG. 2(C). This second embodiment differs from the first shown in FIG. 2(B) in that a first plurality of N+ well regions is formed on a first major surface of a N− semiconductor substrate 12. Thereafter, a cathode electrode 2 is formed in ohmic contact with the first major surface. Separately, P− well regions 10, P+ well regions 6, and anode electrode 1 are formed on a second major surface of N− semiconductor substrate 12 in the manner described above.

Within the preferred embodiments described above, reverse recovery time is reduced and switching capability improved. This is accomplished by the improved anode function brought about by the relationship between the anode electrode 1 and the P-type well structure formed by P− well regions 10 and P+ well regions 6. This arrangement allows electrical charge in the form of excess minority carders to be quickly removed during a switching operation, thereby increasing switching speed at reduced voltage drop.

Figure 3A:
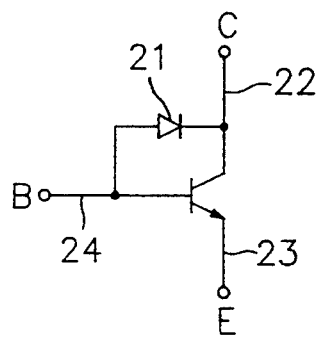
FIG. 3(A) is a circuit diagram showing an equivalent circuit for a transistor and clamping diode in which embodiments of the present invention find application.

When the present invention is used in a discrete device such as the transistor/clamping diode circuit shown for example in FIG. 3(A), the diode voltage drop is lower than that of the base-collector junction of the transistor. Accordingly, transistor saturation is facilitated, reverse recovery time is improved, and switching speed is improved. In FIG. 3(A), a transistor includes collector terminal 22, base terminal 24, and emitter terminal 23. Diode 21, formed according to the present invention, is connected between collector terminal 22 and base terminal 24.

The present invention thus finds ready application in transistor circuits implemented on semiconductor substrates. For example, as shown in FIG. 3(B) the diode structure described above can be combined with at least one insulated gate, bipolar transistor to form a novel circuit having improved performance characteristics.

Figure 3B:
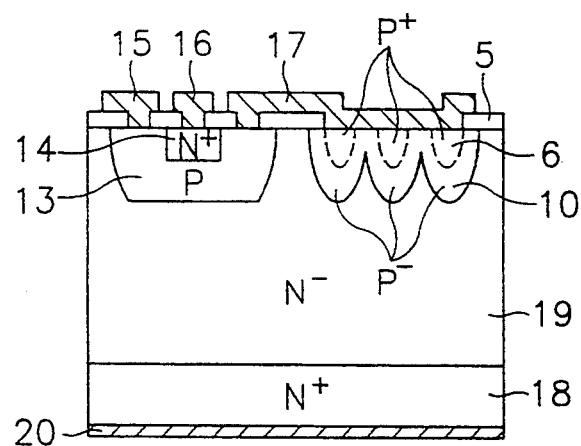
FIG. 3(B) is sectional view of a vertical structure, PN junction diode according to the present invention connected in parallel to an insulated gate bipolar transistor for free wheeling operation.

As shown in FIG. 3(B), the semiconductor device comprises a transistor and adjacent, laterally disposed diode. A first N+ semiconductor layer 18 is formed in ohmic contact with cathode electrode 20. Second N− semiconductor layer 19 is formed over first N+ layer 18. The insulated-gate bipolar transistor structure and lateral diode structure are formed in a second major surface of N− layer 19 opposing a first major surface contacting N+ layer 18.

The transistor structure comprises P-type base region 13 formed in the second major surface and N+ emitter region 14 formed in base region 13. First electrode 15 and second electrode 16 are formed in respective ohmic contact with the base region 13 and emitter region 14 through a patterned insulating mask layer 5. The diode structure is formed as described above with the added feature that common anode electrode 17 is formed in ohmic contact with base region 13, and P− well regions 10 and P+ well regions 6 through patterned insulating mask layer 5.

Figure 3C:
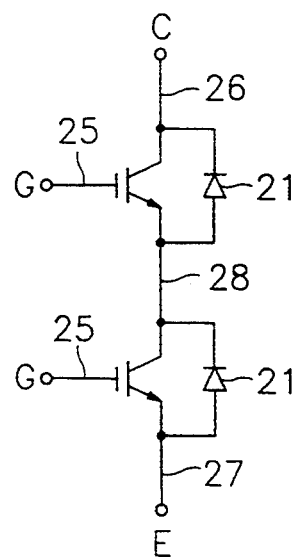
FIG. 3(C) is a circuit diagram showing an equivalent circuit for the embodiment shown in FIG. 3(B)

As shown in FIG. 3(C), the diode of the present invention is connected across emitter and collector of the insulated-gate bipolar transistor to provide free wheeling operation. Within FIG. 3(C), the diodes 21 formed according to the present invention are connected across the collectors 26 and emitters 27 of two totem coupled insulated-gate bipolar transistors 25, (28 designating the connection point between the emitter of one transistor and the collector of the other).

Figure 4:
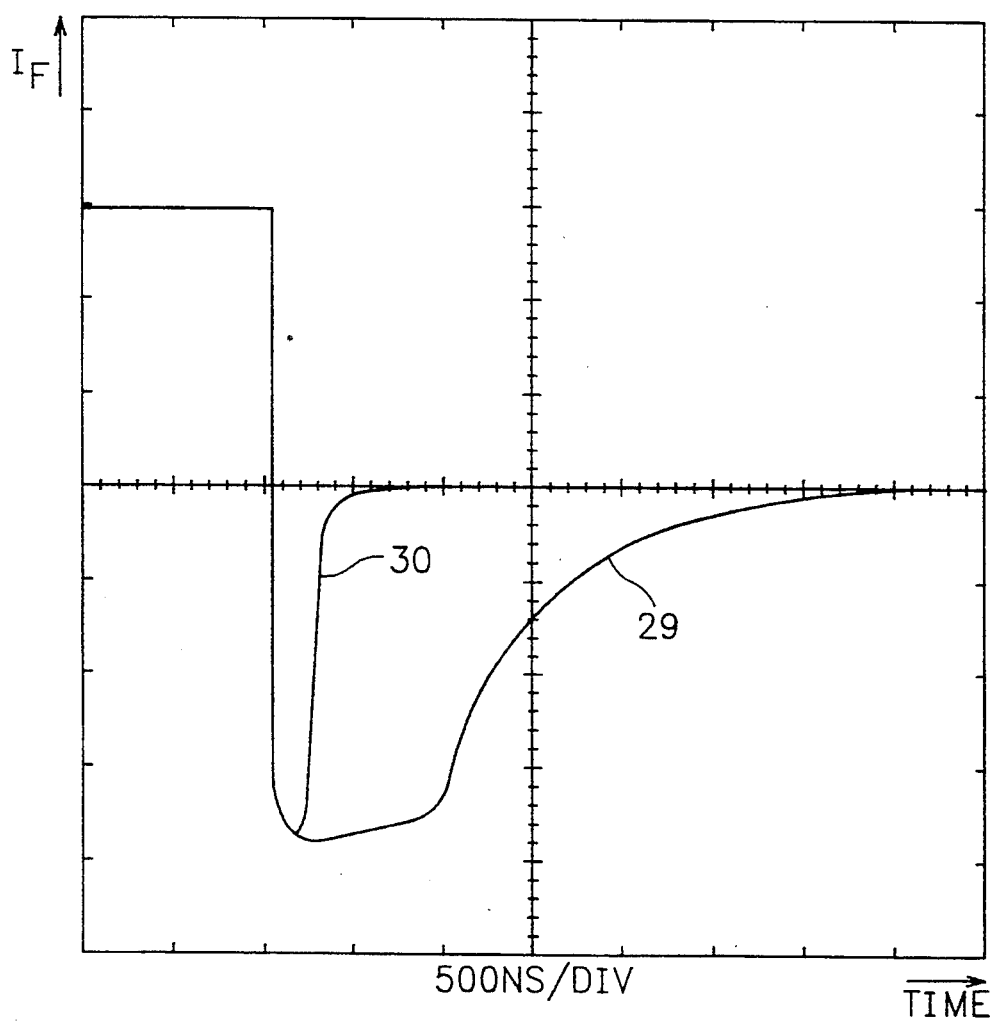
FIG. 4 is a waveform diagram comparing the measured reverse recovery time of diodes constructed according to the present invention with prior art diodes.

Within each of the foregoing embodiments, the diode formed according to the present invention exhibits improved performance characteristics. Chief among these is a reduced reverse recovery time. This characteristic is shown, for example, in FIG. 4. Curve 29 illustrates conventional diode performance, while curve 30 illustrates performance for diodes formed according to the present invention.

The present invention provides for two diffusions of P-type impurities which form first and second well regions within a single semiconductor layer. The present invention, thus, avoids the manufacturing complexity required to produce deep verses shallow diffusions, or adjacent N-type and P-type regions proximate the anode electrode such as those typical in prior art diodes having reduced reverse recovery time. The present invention also avoids high reverse currents and low withstanding voltages which characterize conventional Schottky contact structures. Furthermore, the use of lifetime killer dopants can be avoided. This is particularly important where the diode is used in transistor circuits, since adjacent transistors are adversely affected by the lifetime killer dopant. Thus, the present invention provides a diode having low voltage drop and reduced reverse recovery time without the adverse side effects typical of conventional diodes.

Practitioners will appreciate that the present invention may be practiced in many variations and according to many design considerations which fall within the range of ordinary skill in the art. Such routine design considerations includes reversing the choice of P and N-type impurities, and selection of transistor type. The foregoing embodiments are provided as examples to fully teach the use and making of the present invention. The present invention is not limited to the exemplary embodiments. Rather, the present invention is defined by the attached claims.

What is claimed is:

1. A semiconductor device comprising:
   a semiconductor substrate of first conductivity type having a low impurity density and having first and second major surfaces;
   a first plurality of well regions of first conductivity type selectively formed in said first major surface of said semiconductor substrate, said first plurality of well regions having a high impurity density relative to said semiconductor substrate;
   a cathode electrode formed in ohmic contact with said first major surface;
   a well region of second conductivity type having a low impurity density selectively formed by at least one diffusion in said second major surface;
   a second plurality of well regions of second conductivity type having a high impurity density relative to said well region selectively formed by diffusion in said well region; and,
   an anode electrode overlaying said second major surface and formed in ohmic contact with said well region and said second plurality of well regions.

2. A bipolar semiconductor device comprising:
   a cathode electrode;
   a first semiconductor layer of first conductivity type having a high impurity density formed in ohmic contact with said cathode electrode;
   a second semiconductor layer of first conductivity type having a low impurity density relative to said first semiconductor layer, and having first and second major surfaces, said first major surface formed in contact with said first semiconductor layer opposite said cathode electrode;
   a transistor formed in said second major surface, comprising,
      a base region of second conductivity type formed in said second major surface and a first electrode formed in ohmic contact the said region, and
      an emitter region of first conductivity type formed in said emitter region and a second electrode formed in ohmic contact with said emitter region;
   a diode formed in said second major surface and comprising,
      a well region of second conductivity type having a low impurity density selectively formed by at least one diffusion in said second major surface, and
      a plurality of well regions of second conductivity type having a high impurity density relative to said well region selectively formed by diffusion in said well region; and,
   a common electrode formed over said second major surface in ohmic contact with said well region, said plurality of well regions, and said base region.

* * * * *